United States Patent [19]

Sato et al.

[11] Patent Number: 5,155,005
[45] Date of Patent: Oct. 13, 1992

[54] METHOD OF PRODUCING POLYCHROMATIC COLORED IMAGE

[75] Inventors: Morimasa Sato; Masayuki Iwasaki; Fumiaki Shinozaki, all of Shizuoka, Japan

[73] Assignee: Fuji Photo Film Co., Ltd., Kanagawa, Japan

[21] Appl. No.: 675,825

[22] Filed: Mar. 27, 1991

[30] Foreign Application Priority Data

Mar. 29, 1990 [JP] Japan .................................. 2-82262
Sep. 3, 1990 [JP] Japan .................................. 2-232854

[51] Int. Cl.$^5$ ........................ G03C 11/12; G03F 7/26
[52] U.S. Cl. ...................................... 430/257; 430/7; 430/258
[58] Field of Search ............................. 430/257, 258, 7

[56] References Cited

U.S. PATENT DOCUMENTS

| | | | |
|---|---|---|---|
| 4,304,836 | 12/1981 | Cheema et al. | 430/257 |
| 4,482,625 | 11/1984 | Namiki et al. | 430/257 |
| 4,596,757 | 6/1986 | Barton et al. | 430/257 |
| 4,650,738 | 3/1987 | Platzer et al. | 430/257 |
| 4,877,697 | 10/1989 | Vollmann et al. | 430/257 |
| 5,093,168 | 3/1992 | Suzuki et al. | 430/257 |

Primary Examiner—Richard L. Schilling
Attorney, Agent, or Firm—Sughrue, Mion, Zinn, Macpeak & Seas

[57] ABSTRACT

A method of producing a polychromatic colored image with clear fine patterns, comprising the steps of:
(a) contacting a light-sensitive colored resin layer, provided on a temporary support transmissive of ultraviolet rays with an adhesive layer provided on a permanent support;
(b) imagewise exposing the light-sensitive colored resin layer to a pattern through the temporary support;
(c) peeling the temporary support from the imagewise exposed resin layer;
(d) developing the imagewise exposed colored resin layer to form a colored resin pattern on the adhesive layer;
(e) embedding the colored resin pattern into the surface of the adhesive layer by applying pressure through a material having a surface energy lower than that of both the colored resin pattern and the adhesive layer;
(f) contacting a light-sensitive resin layer of another image-forming material colored in a tint different from resin layers previously formed on the adhesive layer with the adhesive layer; and
(g) repeating the exposure, development and embedding steps as described above; and
(h) repeating these processes until the desired number of colored patterns are formed and embedded in the adhesive layer.

20 Claims, No Drawings

METHOD OF PRODUCING POLYCHROMATIC COLORED IMAGE

FIELD OF THE INVENTION

The present invention relates to a method of producing poly-chromatic colored images on substrates for color filters for use in a liquid crystal color display and the like, and for other color display plates.

BACKGROUND OF THE INVENTION

Generally, the structure of a liquid crystal color display comprises a first multilayer construction having provided on a transparent substrate such as a glass plate and laminated in the following order, a color filter, a protective film, a clear electrode having a matrix-form pattern, an insulating film and an orientation film, and a second multilayer construction provided on a transparent substrate such as a glass plate and laminated in the following order, a sheet-form or striped-pattern of clear electrode and an orientation film, said multilayer structures being opposed such that their respective orientation films face each other to form an inner cell having a thickness defined by a spacer, which cell contains a liquid crystal material. The composite structure is arranged between two polarizing plates. Alternatively, in the first multilayer construction, the clear electrode having a matrix-form pattern may be positioned between the color filter and the transparent substrate.

The color filter generally comprises red, blue and green dot-form images each arranged in a matrix pattern, and their respective boundaries are partitioned by a black matrix.

Also, automobile meters and tachometer panels a generally employ a plastic substrate provided with images of various colors including yellow, cyan, magenta and black colors.

For the purpose of forming colored images on a support as in the above noted applications, a wide variety of methods have hitherto been proposed.

For example, the preparation of a color filter for a liquid crystal display is discussed below.

First, a multicolor image is formed on a transparent substrate, such as a glass plate, used as a support in accordance with (1) a dyeing method, (2) a printing method, or (3) a method using light-sensitive colored resin solutions (i.e., a colored resist method) as disclosed in JP-A-63-298304 (The term "JP-A" as used herein means an "unexamined published Japanese patent application"), JP-A-63-309916, JP-A-01-152449, etc., wherein a light-sensitive colored resin solution is coated, exposed and developed in succession, and these steps are then repeated. Also, a multicolor image can be formed using (4) a method which comprises transferring successively colored images formed on their respective temporary supports onto a final support or another temporary support, as disclosed in JP-A-61-99103, JP-A-61-233704 or JP- A-61-279802, (5) a method as disclosed in JP-A-61-99102, wherein a previously colored light-sensitive resin solution is coated on a temporary support to form a colored layer, the colored layer is transferred directly onto a transparent substrate and then subjected successively to exposure and development, and these steps are then repeated, or (6) a method as disclosed in JP-A-61-256303, which comprises forming a multicolor image on a temporary support by repetition of steps consisting of transfer of a light-sensitive colored layer onto a temporary support, exposure and development, and transferring the thus formed multicolor image onto a final support such as a glass plate. In addition, an electrodeposition method, a photographic method, an evaporation method, a decolorization method, etc., have been used for the above-described purpose.

A protective layer is then formed on the polychromatic colored image for the purpose of physically and chemically protecting the colored image and for leveling the image surface. The protective layer generally comprises a film of high transparency, e.g., a resin film of acryl, urethane, silicone or like type, or a film of metal oxide such as silicon oxide, that is formed using a spin coating process, a roll coating process, a printing process, etc. If necessary, the structure is subjected to level standing and solvent removal, followed by a cure processing.

On the protective layer, a transparent conductive film, such as a tin indium oxide (ITO) film or a tin oxide film, is further formed using a vacuum film-forming process, such as a sputtering process, a vacuum deposition process or the like. An electrode pattern is then formed using a mask evaporation method, an etching method etc., to form a clear patterned electrode layer. The clear patterned layer may also be formed on the transparent substrate below the colored image and the black matrix layer.

Each of the above described conventional methods for forming colored images in the preparation of a color filter are disadvantageous for various reasons as discussed below.

In the dyeing method (1), the steps of coating a photoresist and partly dyeing the dried transparent film are repeated. Thus, repetition of the formation and removal of a reserve printing layer is required such that the production process is complex.

In the printing method (2), the printing ink is poorly transferable to glass such that the colored patterns tend to be inferior in shape and uneven in density. Also, registering is required to prepare three or four differently colored patterns. Therefore, it is difficult to form a color filter of high quality using this method.

In the method (3), the density of the colored layer varies with the thickness of the layer, such that an accurate coating technique is required to provide uniform density throughout the colored layer. In addition, the second colored layer is difficult to coat uniformly since the first colored layer formed prior to coating of the second colored layer has an uneven surface.

In the method (4), it is difficult to precisely arrange images of different colors at their individually intended positions (hereinafter, "registering") upon multiple separate transfers of the colored images to the final support.

As for the methods (5) and (6), although the process for forming colored images is simplified, and although it is easy to control exposure, development and density, and although the registering is also performed without difficulty, these methods are still disadvantageous for reasons as follows.

JP-A-61-99102, JP-A-61-256303 and JP-A-63-187203 disclose methods of producing a color filter, which comprise providing light-sensitive colored resin layers on the surface of a transparent substrate using a transfer technique, and transferring to the final support which is substantially transparent. Transferrable red, blue and green images are formed one after another by imagewise exposure and development. According to these methods, no deviation is caused in the transfer step with respect to the registering of differently colored images. Therefore, these methods are attractive. Moreover, since the light-sensitive colored resin layers previously coated in a uniform and definite thickness are transferred, exposure and development characteristics are stabilized, and good density control of colored images is realized.

However, the colored image that is first formed on the adhesive layer has a height of several microns in accordance with these methods, such that sufficient interlayer contact cannot be realized upon the subsequent transfer of additional colored light-sensitive resin layers. Consequently, colored images formed through exposure and subsequent development steps after the formation of the first colored image are not in sufficient contact with one another.

SUMMARY OF THE INVENTION

A first object of the present invention is to provide a method of producing polychromatic colored images on separate supports for the production of color filters or the like, in high throughput.

A second object of the present invention is to provide a method of producing a highly precise polychromatic colored image composed of differently colored clear image patterns which exhibit distinct boundaries between image patterns without blurring.

A third object of the present invention is to provide a method of producing a polychromatic colored image having enhanced registering accuracy for differently colored image patterns, and which method facilitates the registering operation.

A fourth object of the present invention is to provide a method of producing a polychromatic colored image at low cost using a simplified process.

The above-described objects of the present invention are achieved by each of the following methods:

1. A method of producing a polychromatic colored image, having an integer value of n colored patterns ($n \geq 2$), comprising the steps of:

(a) contacting a light-sensitive colored resin layer of an image-forming material comprising said light-sensitive resin layer provided on a temporary support transmissive of ultraviolet rays with an adhesive layer provided on a permanent support;

(b) imagewise exposing the light-sensitive resin layer to a pattern through the temporary support;

(c) peeling the temporary support from the imagewise exposed light-sensitive resin layer;

(d) developing the imagewise exposed light-sensitive resin layer in a developer to form a colored pattern on the adhesive layer;

(e) embedding the colored pattern formed on the adhesive layer into the surface of the adhesive layer by applying pressure to the colored pattern through a material having a surface energy lower than that of both of the patterned resin layer and the adhesive layer;

(f) contacting a light-sensitive resin layer of another image-forming material comprising a light-sensitive resin layer provided on a temporary support transmissive of ultraviolet rays and which resin layer is colored in a tint different from resin layers previously formed on the adhesive layer with the pattern embedded adhesive layer;

(g) repeating steps (b) to (e); and (h) repeating step (f) followed by steps (b) to (e) n-2 times to form and embed n colored patterns into the adhesive layer.

2. A method of producing a polychromatic colored image having an integer value of n colored patterns ($n \geq 2$), comprising the steps of:

(a) contacting a light-sensitive colored resin layer of an image-forming material comprising a light-sensitive resin layer provided on a temporary support transmissive of ultraviolet rays with an adhesive layer provided on a permanent support;

(b) imagewise exposing the light-sensitive resin layer to a pattern through the temporary support;

(c) peeling the temporary support from the imagewise exposed light-sensitive resin layer;

(d) developing the imagewise exposed light-sensitive resin layer to form a colored pattern on the adhesive layer;

(e) contacting a light-sensitive resin layer of another image-forming material having the same structure as that of step (a) except for having a resin layer colored in a tint different from resin layers previously formed on the adhesive layer with the adhesive layer on which a colored pattern is formed;

(f) imagewise exposing the light-sensitive resin layer to a pattern through the temporary support, (g) peeling the temporary support from the imagewise exposed light-sensitive resin layer;

(h) developing the light-sensitive resin layer in a developer to form a colored pattern on the adhesive layer;

(i) repeating steps (e) to (h) n−2 times to form n colored patterns on the adhesive layer; and (j) embedding the colored patterns colored in at least two different tints which have been formed on the adhesive layer into the surface of the adhesive layer by applying pressure thereto through a material having a surface energy lower than the colored resin patterns and the adhesive layer.

3. A method of producing a polychromatic colored image having an integer value of n colored patterns ($n \geq 2$), comprising the steps of:

(a) contacting a light-sensitive colored resin layer of an image-forming material comprising said light-sensitive resin layer provided on a temporary support via a peel-apart layer, which peel-apart layer is transmissive to ultraviolet rays, with an adhesive layer provided on a permanent support;

(b) peeling the temporary support from the peel-apart layer;

(c) imagewise exposing the light-sensitive resin layer to a pattern through the peel-apart layer;

(d) developing the light-sensitive resin layer in a developer to simultaneously remove the peel-apart layer through dissolution in the developer, and to form a colored pattern on the adhesive layer;

(e) embedding the colored pattern formed on the adhesive layer into the surface of the adhesive layer by applying pressure to the colored pattern through a material having a surface energy lower than both the patterned resin layer and the adhesive layer;

(f) contacting a light-sensitive resin layer of another image-forming material comprising a light-sensitive resin layer provided on a temporary support via a peel-apart layer, which peel-apart layer is transmissive to ultraviolet rays, and which resin layer is colored in a tint different from the resin layers previously formed on the adhesive layer with the pattern-embedded adhesive layer;

(g) repeating step (b) to (e); and (h) repeating step (f) followed by steps (b) to (e) n−2 times to form and embed n colored patterns into the adhesive layer.

4. A method of producing a polychromatic colored image having an integer value of n colored patterns (n≧2), comprising the steps of:

(a) contacting a light-sensitive colored resin layer of an image-forming material comprising said light-sensitive resin layer provided on a temporary support via a peel-apart layer, which peel-apart layer is transmissive to ultraviolet rays, with an adhesive layer provided on a permanent support;

(b) peeling the temporary support from the peel-apart layer;

(c) imagewise exposing the light-sensitive resin layer to a pattern through the peel-apart layer;

(d) developing the light-sensitive resin layer in a developer to simultaneously remove the peel-apart layer through dissolution and to form a colored pattern on the adhesive layer;

(e) contacting a light-sensitive resin layer of another image-forming material comprising a light-sensitive resin layer provided on a temporary support via a peel-apart layer, which peel-apart layer is transmissive to ultraviolet rays, and which resin layer is colored in a tint different from the resin layers previously formed on the adhesive layer, with the adhesive layer on which a colored pattern is formed;

(f) imagewise exposing the light-sensitive resin layer to a pattern through the temporary support, (g) peeling the temporary support from the peel-apart layer;

(h) developing the light-sensitive resin layer in a developer to form a colored pattern on the adhesive layer;

(i) repeating steps (e) to (h) n−2 times to form n colored patterns on the adhesive layer; and (j) embedding the colored patterns colored in at least two different tints which have been formed on the adhesive layer into the surface of the adhesive layer by applying pressure thereto through a material having a surface energy lower than the colored resin patterns and the adhesive layer.

5. A method of producing a polychromatic colored image having an integer value of n colored patterns (n≧2), comprising the steps of:

(a) contacting a light-sensitive colored resin layer of an image-forming material comprising said light-sensitive resin layer provided on a temporary support via a peel-apart layer, which peel-apart layer is transmissive to ultraviolet rays, with an adhesive layer provided on a permanent support;

(b) peeling the temporary support from the peel-apart layer;

(c) imagewise exposing the light-sensitive resin layer to a pattern through the peel-apart layer;

(d) removing the peel-apart layer by washing with water;

(e) developing the light-sensitive resin layer in a developer to form a colored pattern on the adhesive layer;

(f) embedding the colored pattern formed on the adhesive layer into the surface of the adhesive layer by applying pressure to the colored pattern through a material having a surface energy lower than both that of the colored resin pattern and the adhesive layer;

(g) contacting a light-sensitive resin layer of another image-forming material comprising a light-sensitive resin layer provided on a temporary support via a peel-apart layer, which peel-apart layer is transmissive to ultraviolet rays, and which resin layer is colored in a tint different from the resin layers previously formed on the adhesive layer, with the pattern-embedded adhesive layer;

(h) repeating steps (b) to (f); and (i) repeating steps (g) followed by steps (b) to (f) n−2 times to form and embed n colored patterns into the adhesive layer.

6. A method of producing a polychromatic colored image having an integer value of n colored patterns (n≧2), comprising the steps of:

(a) contacting a light-sensitive colored resin layer of an image-forming material comprising said light-sensitive resin layer provided on a temporary support via a peel-apart layer, which peel-apart layer is transmissive to ultraviolet rays, with an adhesive layer provided on a permanent support;

(b) peeling the temporary support from the peel-apart layer;

(c) imagewise exposing the light-sensitive resin layer to a pattern through the peel-apart layer;

(d) removing the peel-apart layer by washing with water;

(e) developing the light-sensitive resin layer in a developer to form a colored pattern on the adhesive layer;

(f) contacting a light-sensitive resin layer of an another image-forming material comprising a light-sensitive resin layer provided on a temporary support via a peel-apart layer, which peel-apart layer is transmissive to ultraviolet rays, and which resin layer is colored in a tint different from the resin layers previously formed on the adhesive layer, with the adhesive layer on which a colored pattern is formed;

(g) peeling the temporary support from the peel-apart (h) imagewise exposing the light-sensitive resin layer to a pattern through the peel-apart layer;

(i) removing the peel-apart layer by washing with water;

(j) developing the light-sensitive resin layer in a developer to form a colored pattern on the adhesive layer;

(k) repeating steps (f) to (j) n−2 times to form n colored patterns on the adhesive layer; and (l) embedding the colored patterns colored in at least two different tints which have been formed on the adhesive layer into the surface of the adhesive layer by applying pressure thereto through a material having a surface energy lower than that of the colored resin patterns and the adhesive layer.

DETAILED DESCRIPTION OF THE INVENTION

The process of embedding a colored pattern in the surface of the adhesive layer by the application of pressure, which embedding may be carried out each time a pattern of a particular color has been formed and has not yet been laminated with a light-sensitive resin layer colored in a second tint, can also be performed at the conclusion of all the individual processes for forming patterns of different colors. Patterns of different colors are prepared by forming a pattern of a particular color, immediately thereafter laminating the formed pattern with a light-sensitive resin layer colored in a second tint, exposing and developing the resin layer to form a second pattern of the second color, and repeating these image-forming processes to obtain the number of desired colored patterns.

It is essential to the present invention that the processes described and claimed herein are carried out in their order of description. Other processes which have no adverse influence on the effects of the present invention, for example, a washing process subsequent to the development, may be safely inserted within the processing sequence.

In accordance with the present invention, the following advantages are realized.

(1) Exposure and development characteristics are stabilized, and the control of color density is facilitated, because image-forming materials previously colored in different tints, each of which has a uniform coating thickness, are used;

(2) The registering of patterns with different colors is simply conducted;

(3) The polychromatic colored image thereby obtained is excellent in flatness, because the patterns are, in a substantial sense, embedded in the adhesive layer, and the patterns, as the whole, are excellent in adhesiveness to the support and in accuracy;

(4) The colored image thereby obtained have high durability;

(5) Coating problems, for example, stability of coating compositions, are avoided, because the light-sensitive materials are supplied in the form of a colored layer; and (6) Adhesion of the produced image when using a glass support is satisfactory, because an adhesive layer is provided on the support, etc.

Materials for use in the present invention are described below in detail.

The temporary support having provided thereon a light-sensitive colored resin layer for use in the present invention should have flexibility, is preferably transmissive to ultraviolet rays, and which does not substantially deform, shrink or elongate under applied pressure, or under applied pressure and heat. Useful temporary supports include a polyethylene terephthalate film, a cellulose triacetate film, a polystyrene film, a polycarbonate film, etc. Among these films, biaxially stretched polyethylene terephthalate films are preferred. The temporary support to be used in the present invention generally has a thickness of from 10 to 200 $\mu$m, preferably from 50 to 175 $\mu$m, and more preferably from 75 to 100 $\mu$m.

On the temporary support, a light-sensitive colored resin layer is provided directly or via a peel-apart layer arranged between the resin layer and the temporary support, which peel-apart layer is transmissive to ultraviolet rays.

When the light-sensitive colored resin layer is provided directly onto the transparent support, the temporary support is transmissive to ultraviolet rays to an extent sufficient to cure the resin layer. On the other hand, when the resin layer is provided through a peel-apart layer, ultraviolet transmission is not essential for the temporary support because the exposure can be carried out after the temporary support is peeled apart from the resin layer.

The peel-apart layer is provided in order to enable the temporary support to be readily peeled apart from the colored light-sensitive resin layer after the resin layer is adhered to the permanent support. Although the peeling can be carried out either before or after imagewise exposure, peeling before the exposure is preferred for enhancing the resolving power of the images. In this case, it is desirable that the peel-apart layer is reading peeled from the temporary support and also has moderate adhesiveness to the temporary support such that oxygen from the air, which inhibits the photosetting reaction in the light-sensitive color resin layer upon imagewise exposure, is not diffused into the resin layer. Also, the peel-apart layer is designed so as not to be mechanically peeled apart from the resin layer, and to prevent oxygen gas from the ambient from reaching the resin layer.

Such a peel-apart layer as described above can be formed by coating a polymer solution onto the temporary support. Examples of useful polymers for forming the peeling-apart layer include polyvinyl alcohol, water-soluble partially esterified, etherified or acetalated polyvinyl alcohols, 88–99% hydrolyzed polyvinyl acetate, gelatin, gum arabic, methyl vinyl ether/maleic anhydride copolymers, polyvinyl pyrrolidone, high molecular weight water-soluble ethylene oxide polymers having a mean molecular weight of from 100,000 to 3,000,000 and mixtures of two or more of these polymers, as described in JP-B-46-32714 and JP-B-56-40824 (The "JP-B" as used herein means an "examined Japanese patent publication") (corresponding to U.S. Pat. No. 3,884,693).

In forming the peel-apart layer on the temporary support, a coating solution containing a polymer as described above dissolved in water or a mixture of water with an organic solvent is used. When a surface active agent is further added to this solution, a more uniform peel-apart layer is obtained. The peel-apart layer preferably has a thickness of from 0.2 to 10.0 $\mu$m, and more preferably from 0.5 to 5.0 $\mu$m. When the layer has a thickness of less than 0.2 $\mu$m, the peeling-apart layer does not effectively protect the resin layer from oxygen, whereas when the thickness is increased beyond 10 $\mu$m, the time for dissolving the layer in a developer is excessive.

Useful surface active agents for the peel-apart coating solution include anionic, cationic and nonionic surface active agents with specific examples thereof including sodium $C_{12-18}$ alkylsulfates or alkylsulfonates (such as sodium dodecylsulfate, sodium octadecylsulfonate, etc.), N-cetyl-betaine, C-cetylbetaine, alkylaminocarboxylates, alkylaminodicarboxylates, and polyethylene glycols having a mean molecular weight of less than 400.

The colored light-sensitive resin layer provided on the temporary support or peeling-apart layer is formed by coating a negatively working light-sensitive resin composition having dissolved or dispersed therein a dye or pigment of the desired color.

Negatively working light-sensitive resin compositions for use in the present invention include those broadly divided into, e.g., four main groups as described below.

(1) Light-sensitive resin compositions comprising a negatively working light-sensitive diazo resin and a binder Useful examples of this type of negatively working light-sensitive diazo resin include those disclosed in U.S. Pat. Nos. 2,063,631 and 2,667,415, or the reaction products of diazonium salts with reactive carbonyl group-containing organic condensing agents, such as formaldehyde. In particular, the condensation product of diazodiphenylamine-p-diazonium salt and formaldehyde is preferred. In addition to these diazo resins, those disclosed in JP-B-49-48001, JP-B-49-45322 and JP-B-49-45323 are also useful.

The above described negatively working light-sensitive diazo resins are soluble in water, such that they can be used in the form of an aqueous coating solution in forming a light-sensitive resin layer. On the other hand, these water-soluble diazo resins can be converted into a substantially water-insoluble but organic solvent-soluble form by reacting with aromatic or aliphatic compounds containing one or more of a phenolic hydroxyl group and/or a sulfo group in accordance with the method described in JP-B-47-1167. Suitable examples of compounds containing phenolic hydroxyl group(s) include hydroxybenzo-phenones such as 4-hydroxybenzophenone, 2,4-dihydroxybenzo-phenone, 2-hydroxy-4-methoxybenzophenone, 2,2'-dihydroxy -4,4'-dimethoxybenzophenone and 2,2',4,4'-tetrahydroxybenzo-phenone; 4,4--bis(4'-hydroxyphenyl)pentanoic acid, resorcinol, and those having alkyl, alkoxy and/or like substituent(s) on the benzene rings of these compounds; etc. Suitable examples of sulfonic acids include aromatic sulfonic acids, such as benzenesulfonic acid, toluenesulfonic acid, xylenesulfonic acid, naphthalenesulfonic acid, phenolsulfonic acid, naphtholsulfonic acid, benzophenonesulfonic acid, etc.; and soluble salts of these sulfonic acids, such as ammonium salts thereof, and alkali metal salts thereof. These sulfo group-containing compounds may be substituted by one or more of a lower alkyl group, a nitro group, or a halogen atom. Specific examples of preferred sulfo group-containing compounds include benzenesulfonic acid, toluenesulfonic acid, naphthalenesulfonic acid, 2,5-dimethylbenzenesulfonic acid, sodium benzenesulfonate, naphthalene-2-sulfonic acid, 1-naphthol-2-sulfonic acid, 1-naphthol-4-sulfonic acid, 2,4-dinitro-1-naphthol-7-sulfonic acid, hydroxy-4-methoxybenzophenone -5-sulfonic acid, o-toluidine-m-sulfonic acid, and ethanesulfonic acid.

As for the preparation of the above described substantially water-insoluble light-sensitive diazo resins, an aqueous solution of a water-soluble light-sensitive diazo resin and that of a phenol compound or a sulfonic acid compound are mixed in about equimolar amounts, based on the diazonium group and the phenolic or sulfo group, respectively, to form the isolated product as a precipitate.

In addition, the light-sensitive diazo resins disclosed in British Patent 1,312,925 are also favored. A highly desirable light-sensitive diazo resin is the 2-methoxy-4-hydroxy-5-benzoylbenzenesulfonic acid salt of p-diazodiphenylamine-formaldehyde condensate.

The light-sensitive diazo resin is contained in the light-sensitive resin layer in an amount of from 5 to 50% by weight based on the total weight of the light-sensitive resin layer. When the content of the light-sensitive diazo resin is increased, the storage stability is lowered although the sensitivity is enhanced. A particularly preferred content of the light-sensitive diazo resin in the light-sensitive resin layer is from 8 to 20% by weight.

The binder for use in the light-sensitive resin layer includes various high molecular weight compounds. Preferred binders are those containing carboxyl, hydroxyl, amino, carbonamido, sulfonamido, active methylene, thioalcoholic and/or epoxy groups in the molecule thereof.

For a water-soluble light-sensitive resin composition, the combination of a water-soluble light-sensitive diazo resin with a water-soluble binder is employed. Typical examples of the water-soluble binder include polyvinyl alcohol, polyvinyl pyrrolidone, polyacrylamide, hydroxymethyl cellulose, gelatin, etc. On the other hand, binders suitable for the use in a water-insoluble light-sensitive resin composition, which is preferred with respect to storage stability, include the shellac as disclosed in British Patent 1,350,521; polymers containing hydroxyethyl(meth)acrylate as a constitutional repeating unit as disclosed in British Patent 1,460,978 and U.S. Pat. No. 4,123,276; the polyamide resin disclosed in U.S. Pat. No. 3,751,257; the phenol resins disclosed in British Patent 1,074,392; polyvinyl acetal resins such as polyvinyl formal resin, polyvinyl butyral, etc.; the linear polyurethane resin disclosed in U.S. Pat. No. 3,660,097; polyvinyl alcohol phthalate resins; epoxy resins, or polycondensates of bisphenol A and epichlorohydrin; amino group-containing polymers, such as polyaminostyrene, polyalkylamino(meth)-acrylate, etc.; cellulose derivatives, such as cellulose acetate, cellulose alkyl ether, cellulose acetate phthalate, etc.; and water soluble polyvinyl alcohol.

The content of the binder in the light-sensitive resin layer is preferably from 50 to 95% by weight based on the total weight of the light-sensitive resin layer. When the content of the binder is decreased, the sensitivity is enhanced but the storage stability is lowered. The content of the binder is more preferably within the range of from 80 to 92% by weight.

(2) Photopolymerizing compositions

A photopolymerizing composition for use in the present invention essentially contains an addition polymerizing unsaturated monomer, a photopolymerization initiator, and a binder. An addition polymerizing unsaturated monomer is a compound containing in a molecule thereof at least one ethylenic unsaturated group capable of undergoing addition polymerization, and having a boiling point of 100° C. or higher under atmospheric pressure. Specific examples of the addition polymerizing unsaturated monomer include monofunctional acrylates and methacrylates, e.g., polyethylene glycol mono(meth)acrylate, polypropylene glycol mono(meth)acrylate, phenoxyethyl(meth)acrylate, etc.; and polyfunctional acrylates and methacrylates, e.g., polyethylene glycol di(meth)acrylate, polypropylene glycol di(meth)acrylate, trimethylolethane triacrylate, trimethylolpropane diacrylate, neopentyl glycol di(meth)acrylate, pentaerythritol tetra (meth)acrylate, pentaerythritol tri(meth)acrylate, dipentaerythritol hexa(meth)acrylate, dipentaerythritol penta(meth)acrylate, hexanediol di(meth)acrylate, trimethylolpropane tri(acryloyloxypropyl) ether, tri(acryloyloxyethyl)isocyanurate, tri(acryloyloxyethyl) cyanurate, glycerine tri(meth)acrylate; reaction products obtained by carrying out the addition of a polyfunctional alcohol, such as trimethylolpropane, glycerine or the like, to ethylene oxide or propylene oxide, and then having the resulting adduct undergo (meth)acrylation; urethaneacrylates as disclosed in JP-B-48-41708, JP-B-50-6034 and JP-A-51-37193; and polyester acrylates and epoxyacrylates which are the reaction products of epoxy resins and (meth)acrylic acid as disclosed in JP-A-48-64183, JP-B-49-43191 and JP-B-52-30490. Among the above described moreovers, trimethylolpropane tri(meth)acrylate, pentaerythritol tetra(meth)acrylate, dipentanerythritol hexa(meth)acrylate and dipentaerythritol penta(meth)acrylate are preferred.

The content of the addition polymerizing unsaturated monomer in the photopolymerizing composition is from 5 to 50% by weight, preferably from 10 to 40% by weight, based on the total weight of the photopolymerizing composition. When the content is lower than 5% by weight, the photosensitivity and the image strength are reduced, whereas when the content of the addition polymerizing unsaturated monomer is increased beyond 50% by weight, the light-sensitive resin layer becomes too sticky.

Useful examples of the photopolymerization initiator, include vicinal polyketaldonil as disclosed in U.S. Pat. No. 2,367,660, the acyloin ether compounds as disclosed in U.S. Pat. No. 2,448,828, the α-hydrocarbon substituted aromatic acyloin compounds as disclosed in U.S. Pat. No. 2,722,512, polynuclear quinone compounds as disclosed in U.S. Pat. Nos. 3,046,127 and 2,951,758, the combinations of triarylimidazole dimers with p-aminoketones as disclosed in U.S. Pat. No. 3,549,367, the benzothiazole compounds and trihalomethyl -s-triazine compounds as disclosed in JP-B-51-48516, the trihalomethyl-s-triazine compounds as disclosed in U.S. Pat. No. 4,239,850, and the trihalomethyloxadiazole compounds as disclosed in U.S. Pat. No. 4,212,976. Particularly preferred among the above-noted photopolymerization initiators are trihalomethyl-s-triazines, trihalomethyloxadiazoles, and triarylimidazole dimers.

The content of the photopolymerization initiator in the photopolymerizing composition is from 0.5 to 20% by weight, preferably from 2 to 15% by weight, based on the total weight of the photopolymerizing composition. When the content is less than 0.5% by weight, the photosensitivity and the image strength are reduced, whereas when the content of the photopolymerization initiator is more than 20% by weight further increase in effect is not obtained.

A desirable binder is an organic linear macromolecule that is compatible with addition polymerizing unsaturated monomers, soluble in organic solvents, and soluble or at least sellable in a weak alkaline aqueous solution. Useful examples of the organic linear macromolecule as described above include polymers containing carboxyl groups in their side chains, such as methacrylic acid copolymers, acrylic acid copolymers, itaconic acid copolymers, crotonic acid copolymers, maleic acid copolymers and partially esterified maleic acid copolymers as disclosed in JP-A-59-44615, JP-B-54-34327, JP-B-58-12577, JP-B-54-25957, JP-A-59-53836 and JP-A-59-71048; and cellulose derivatives containing carboxyl groups in the side chains thereof. In addition, those obtained by the addition of cyclic acid anhydrides to hydroxyl group-containing polymers are also useful. In particular, copolymers of benzyl(metha)acrylate and (meth)acrylic acid, and plural copolymers of benzyl(meth) acrylate, (meth)acrylic acid and other monomers are preferred. Although all the above-noted binders are insoluble in water, water-soluble polymers such as polyvinyl pyrrolidone, polyethylene oxide, polyvinyl alcohol and the like, can be also used as the binder.

Furthermore, alkali-insoluble polymers can be added for the purpose of improving various properties, e.g., the strength of a cured film, as long as the alkali-insoluble polymers do not exert any adverse effects upon developability, etc. Examples of such polymers include alcohol-soluble nylon and epoxy resins.

The content of the binder in the photopolymerizing composition is from 50 to 95% by weight, preferably from 60 to 90% by weight, based on the total weight of the photopolymerizing composition. When the content is less than 50% by weight, the light-sensitive resin layer is too tacky, whereas when the content of the binder is increased beyond 95% by weight, the composition is reduced in strength of the image formed and photosensitivity.

In addition to the above-described constituent elements, it is desirable to further add a thermal polymerization inhibitor to the photopolymerizing composition. Examples thereof include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenzimidazole, phenothiazine, etc.

(3) Light-sensitive resin compositions comprising an azide compound and a binder Suitable examples of the above-noted light-sensitive resin composition include those which comprise an azide compound and a high molecular weight binder soluble in water or an alkaline aqueous solution as disclosed in British Patents 1,235,281 and 1,495,861, JP-A-51-32331, JP-A-51-36128, etc.; and those which comprise an azido group-containing polymer and a high molecular weight compound as a binder as disclosed in JP-A-50-5102, JP-A-50-84302, JP-A-53-12984, etc.

These light-sensitive resin compositions are used in an amount so as to give the colored pattern in the similar thickness as obtained in the other light-sensitive resin compositions as mentioned above.

(4) Cinnamic acid type light-sensitive resins

Suitable examples of the above note dresins include light-sensitive polyesters as disclosed, e.g., in JP-A-52-96696, and polyvinyl cinnamates as disclosed in British Patents 1,112,277, 1, 313,390, 1,341,004 and 1,377,747.

These light-sensitive resins are used in an amount so as to give the colored pattern in the similar thickness as obtained in the other light-sensitive-resin compositions as mentioned above.

In forming a colored light-sensitive resin layer comprising a pigment or a dye and a negatively working light-sensitive resin composition, the negatively working light-sensitive resin composition is dissolved in a proper solvent, and therein is dispersed a single pigment or a mixture of two or more pigments, or dissolved a dye to prepare a coating composition colored in a single hue. The coating composition is coated on a temporary support as described above using a spinner, a whirler, a roller coater, a curtain coater, a knife coater, a wire-bar coater, an extruder, etc.

For color filters, red, green, blue and black pigments are used. Preferred examples of these pigments include Carmine 6B (C.I. 12490), Phthalocyanine Green (C.I. 74260), Phthalocyanine Blue (C.I. 74160), and Mitsubishi Carbon Black MA-100.

For display plates such as a meter panel for automobiles, yellow, magenta, cyan and black pigments or dyes are used. In addition, metal powders, white pigments, fluorescent pigments, etc. can also be employed. Specific (examples of preferred pigments include #1201 Lionol Yellow (C.I. 21090), Lionol Yellow GRO (C.I. 21090), Shimura Fast Yellow 8GF (C.I. 21105), Benzidine Yellow 4T-564D (C.I. 21095), Shimura Fast Red 4015 (C.I. 12355), Lionol Red 7B4401 (C.I. 15850), Fastgen Blue TGR-L (C.I. 74160), Lionol Blue SM (C.I. 26150), Mitsubishi Carbon Black MA-100, and Mitsubishi Carbon Black #40. Preferred dyes include Victoria Pure Blue (C.I. 42595), Auramine O (C.I. 41000), Carotene Brilliant Flavin (C.I. basic 13), Rhodamine 6GCP (C.I. 45160), Rhodamine B (C.I. 45170), Safranine OK70:100 (C.I. 50240), Erioglaucine X (C.I. 42080), and Fast Black HB (C.I. 26150).

It is desirable that the pigment or dye as noted above is incorporated in a light-sensitive resin layer to be colored in an amount of from 1 to 30% by weight, preferably from 5 to 20% by weight, based on the total weight of the light-sensitive resin layer.

Solvents suitable for preparing the coating composition include benzene, toluene, xylene, cyclohexane, ethylene glycol monomethyl ether, ethylene glycol monoethyl ether, propylene glycol monomethyl ether, propylene glycol monoethyl ether, ethylene glycol monomethyl ether acetate, ethylene glycol monoethyl ether acetate, propylene glycol monomethyl ether acetate, propylene glycol monoethyl ether acetate, acetone, methyl ethyl ketone, methyl isobutyl ketone, cyclohexa-none, methyl acetate, ethyl acetate, propyl acetate, butyl acetate, methyl lactate, ethyl lactate, methanol, ethanol, 1-propanol, 2-propanol, butanol, secbutanol, tert-butanol, N-methylpyrrolidone, dimethylformamide, dimethylacetamide, γ-butyrolactone, ε-caprolactame, dimethyl sulfoxide, hexamethyl phosphoryl amide, and water. These solvents can be used alone or in a mixture of two or more.

The concentration of solid components in the coating composition ranges from 1 to 50% by weight, preferably from 5 to 40% by weight. A dry thickness of the colored light-sensitive resin layer is preferably from 0.3 to 10 μm, more preferably from 0.5 to 5 μm.

The permanent support provided with an adhesive layer is substantially not deformed, shrunk or elongated under applied pressure or under applied pressure and heat, and optionally is transmissive to ultraviolet rays. Examples of such a support include a polyethylene terephthalate film, a cellulose triacetate film, a polystyrene film, a polycarbonate film, and a glass plate. Among these materials, a biaxially stretched polyethylene terephthalate film and a glass plate are preferred in particular.

The permanent support which is preferably used in the present invention include those having a thickness of from 0.1 to 10 mm, preferably from 0.5 to 5 mm, and more preferably from 0.5 to 2 mm.

When the final colored images are utilized as color filters, it is necessary for the support to be substantially transparent, and for such a purpose, the above-cited polymer films or a glass plate can be used as the support. Also, a transparent support provided with matrix-form clear electrodes may be used.

When the final colored images are utilized as a color display plate, transparent, translucent or opaque plastic films or plates, glass plates and the like are suitably used as the support. Specifically, polycarbonate plates, which may contain an opaque inorganic filler are preferred.

On a permanent support as described above, an adhesive layer is provided. The adhesive layer is such that it acquires satisfactory adhesiveness to the above-described light-sensitive colored resin layer when brought into contact with one another and to also ensure sufficient adhesion when colored images formed by subjecting the light-sensitive colored resin layer to imagewise exposure and subsequent development are embedded therein. Furthermore, the adhesive layer has sufficient resistance to an alkaline aqueous developer used to develop the light-sensitive colored resin layer. As the resistance to the alkaline, the adhesive layer is required to withstand soaking in a 1% aqueous solution of sodium carbonate at 33° C. for 10 minutes.

In order to satisfy these requirements, the adhesive layer must be soft at room temperature, or must become soft when heated. As such an adhesive layer, those having a glass transition point of not more than 130° C., preferably not more than 100° C. and more preferably not more than 80° C. are preferred.

Adhesive layers which satisfy the above requirements include a layer formed by a thermoplastic polymer. Examples of such a thermoplastic polymer include the image-accepting materials disclosed in JP-A-51-5101.

Among such thermoplastic polymers, those having a glass transition point within the range of 10° C. to 140° C. are preferred.

As another example, layers containing pressure-sensitive adhesives or heat-sensitive adhesives as disclosed in JP-B-46-15326 and JP-B-59-14736 can be used in the present invention.

Adhesive layers preferably used in the present invention include the photopolymerizable image-accepting layer as disclosed in JP-A-59-97140, or the image-receiving layers disclosed in JP-A-61-189535 and JP-A-01-65064 which have a two-layer structure including a mold releasing layer. These layers are employed as an adhesive layer, and irradiated with ultraviolet rays after the images are embedded in the adhesive layer, resulting in the curing of the adhesive layer. Thus, the adhesive layer is firmly adhered to the support by this processing.

In this case, certain precautions must be taken in the pattern exposure of the colored image-forming layer to avoid curing of the photopolymerizable image-accepting layer. For example, the photosensitivity of the photopolymerizable image-accepting layer is adjusted to be less than about one-third that of the colored image-forming layer, or photopolymerization initiators which are photosensitive in different wave-length regions are employed.

The adhesive layer has a thickness sufficient to embed the colored images therein after image formation. More specifically, a thickness ranging from 1 to 100 μm, especially from 5 to 30 μm, is preferable. When the thickness is less than 1 μm, the embedding of the colored images therein is insufficient, and the second colored image, etc. are inferior in closeness of contact between the second and the successive colored images and the adhesive layer, whereas when the adhesive layer is thicker than 100 μm, the sheet provided therewith tends to exhibit a storage problem.

The developer can be used as a bath, or in an atomized condition. The removal of unexposed parts from the colored light-sensitive resin layer can be carried out to advantage using known methods, e.g., by rubbing with a brush, wet sponge and the like rubbing means.

A medium used in developing the colored light-sensitive resin layer after exposure is an aqueous medium, or a medium mainly containing water. Also, it is preferable that an organic solvent compatible with water and an alkaline substance are added to the developer, if necessary.

Suitable examples of an organic solvent for addition to the developer include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, and hexamethylphosphorylamide.

Suitable examples of an alkaline substance include hydroxides of alkali metals [such as sodium hydroxide and potassium hydroxide), carbonates of alkali metals (such as sodium carbonate and potassium carbonate), hydrogen bicarbonates of alkali metals (such as sodium hydrogen carbonate and potassium hydrogen carbonate), silicates of alkali metals (such as sodium silicate and potassium silicate), metasilicates of alkali metals (such as sodium metasilicate and potassium metasilicate), triethanolamine, diethanolamine, monoethanolamine, morpholine, trialkylammonium hydroxides, and trisodium phosphate.

The developer may also contain a swelling agent. Alkylnaphthalenesulfonates poor in foaming ability are preferred as the swelling agent.

Particularly preferred developers, include an aqueous solution containing ethylene glycol mono-n-butyl ether and sodium carbonate, and an aqueous solution containing benzyl alcohol, sodium carbonate, sodium hydroxide and sodium butylnaphthalenesulfonate.

Materials having a lower surface energy than both the adhesive layer and the colored images of the present invention include those disclosed, for example, in JP-A-2-232854. Specific examples thereof include silicone resins and fluorine-containing resins. In embedding the colored image(s) formed on an adhesive layer into the adhesive layer, pressure is applied thereto through a low surface-energy material as described above. The pressure application can be performed to advantage by using a roller made from a low surface-energy material, or by inserting a film made from a low surface-energy material or a flexible synthetic polymer film coated with a low surface-energy material between the colored image(s) on the adhesive layer and a roller made from rubber. A suitable thickness for the film made from a low surface-energy material is from 5 to 200 μm, particularly preferably from 7 to 100 μm. Preferable conditions for the embedding processing are a pressure of from 1 to 3 Kg/cm$^2$ and a processing speed of from 0.1 to 3 m/min, and more preferred conditions are a pressure of from 1.5 to 2.5 Kg/cm$^2$ and a processing speed of from 0.2 to 2 m/min.

In accordance with the present invention, it is preferred that heat be applied simultaneously with the application of pressure. The heat application is readily achieved using a roller equipped with a heat evolving device on the inside thereof, and a surface temperature of the roller is controlled to from 50° to 160° C., preferably from 80° to 120° C.

The present invention is illustrated in further detail below by reference to the following examples. However, the invention is not to be construed as being limited to these examples.

EXAMPLE 1

(An example of utilizing light-sensitive layers not having a subbing layer and a monolayer-form photosensitive adhesive layer)

Coating compositions for forming colored light-sensitive resin layers were prepared comprising light-sensitive solutions of four different colors including a black color (for a light-shielding layer), a red color (for a R layer), a green color (for a G layer) and a blue color (for a B layer) having the compositions shown in the following Table 1 below.

TABLE 1

(Coating Compositions for Colored, Light-Sensitive Layers)

| | Red (g) | Blue (g) | Green (g) | Black (g) |
|---|---|---|---|---|
| Benzylmethacrylate/Methacrylic Acid Copolymer (molar ratio = 73/27, viscosity = 0.12) | 60 | 60 | 60 | 60 |
| Pentaerythritol Tetraacrylate | 43.2 | 43.2 | 43.2 | 43.2 |
| Michler's Ketone | 2.4 | 2.4 | 2.4 | 2.4 |
| 2-(o-Chlorophenyl)-4,5-diphenylimidazole Dimer | 2.5 2.5 | 2.5 2.5 | 2.5 2.5 | 2.5 2.5 |
| Irgadine Red BPT (red color) | 5.4 | | | |
| Sudan Blue (blue color) | | 5.2 | | |
| Lead Phthalocyanine (green color) | | | 5.6 | |
| Carbon Black (black color) | | | | 5.6 |
| Methyl Cellosolve Acetate | 560 | 560 | 560 | 560 |
| Methyl Ethyl Ketone | 280 | 280 | 280 | 280 |

These light-sensitive solutions were coated uniformly on four separate polyethylene terephthalate films (20 μm in thickness) employed as temporary supports, and dried to form light-sensitive colored resin layers each having a dry thickness of 0.5 μm.

A 30 μm-thick polyethylene film was laminated as a protective film on each of the light-sensitive colored resin layers.

Thus, four kinds of light-sensitive colored resin sheets (negatively working, light-sensitive, colored sheets) were prepared, each consisting of the temporary support, the light-sensitive colored resin layer and the protective film, arranged in that order.

Separately, an adhesive layer was formed on a glass plate in the following manner.

A 1.6 mm-thick glass plate was washed with a weak alkaline aqueous solution, and then with water. After drying, the glass plate was coated with the following coating composition for forming an adhesive layer, and then dried. Thus, an adhesive layer having a dry thickness of 5 μm was formed. On this adhesive layer, a 30 μm-thick polyethylene film was laminated as a protective film.

| Coating Composition for Adhesive Layer: | |
|---|---|
| Methyl ethyl ketone | 2,600 g |
| Dianal BR-77 (acrylic resin, products of Mitsubishi Rayon Company Limited) | 168 g |
| Dianal BR-64 (acrylic resin, products of Mitsubishi Rayon Company Limited) | 168 g |
| Oxylac SH-101 (styrenemonopropyl maleate copolymer, products of Nippon Shokubai Kagaku Kogyo Co., Ltd.) | 59 g |
| NK Ester TMMT (pentaerythritol tetraacrylate, products of Shin Nakamura Kagaku K.K.) | 216 g |
| Megafac F-177P (fluorine-contained surface active agent, products of Dai-Nippon Ink & Chemicals, Inc.) | 3.8 g |
| Hydroquinone monomethyl ether | 0.5 g |
| Irgacure 651 (dimethoxyphenylacetophenone, products of Ciba Geigy Ltd.) | 15 g |
| Silane coupling agent KBM-403 (γ-glycidoxypropyltrimethoxysilane, products of Shinetsu Silicone Co., Ltd.) | 2.5 g |

The protective film was peeled apart from the light-sensitive red resin sheet. The resulting sheet was superposed on the glass plate from which the protective film had been removed, such that the light-sensitive resin layer was contacted with the adhesive layer on the glass plate. Then, the superposed matter was subjected to a laminating operation using a laminator (Fast Laminator 8B-550-80, made by Taisei Shoji K.K.) under an applied pressure of 2 Kg/m², a roller temperature of 105° C., and a laminating speed of 0.9 m/min. Thereafter, the temporary support was peeled apart from the light-sensitive red resin sheet, whereby the light-sensitive red resin layer was transferred to the glass plate through the adhesive layer.

Subsequently, a photomask having a matrix-form pattern of elements having a one-side length of 120 μm was superposed upon the light-sensitive red resin layer laminated on the adhesive layer, and exposed by means of a ultra-high pressure mercury lamp of 2 Kw provided with a cut-off filter for wavelengths below 400 nm, and placed at a distance of 50 cm on the photomask side. The thus exposed light-sensitive red resin layer was developed for 20 seconds at 35° C. using a developer having the composition described below, and subsequently washed with water and dried to obtain a red image on the glass plate.

| Composition of Developer: | |
| --- | --- |
| Sodium carbonate | 15 g |
| Butyl cellosolve | 1 g |
| Water | 1 g |

A 20 μm-thick polyethylene terephthalate film, the surface of which had been treated with a silicone lubricant, was inserted between one of a pair of rollers and the red image on the adhesive layer with its lubricant-treated face turned to the red image face, and the red image covered with this film was passed between the pair of rollers at a roller surface temperature of 105° C., a between-roller pressure of 2.0 Kg/cm² and a passing speed of 0.5 m/min, to thereby embed the red image into the adhesive layer.

To the resulting adhesive layer was transferred the light-sensitive resin layer of a green color in the same manner as described above. Then, a matrix-form photomask was superposed on the light-sensitive green resin layer in such a manner that the green image to be formed was adjacent to the red image. The laminate was exposed to UV rays by means of the device as used above through a cut-off filter for wavelengths below 400 nm, and then developed in the same manner as described above. The thus formed green image was embedded into the adhesive layer using rollers as described above to obtain a green image in the adhesive layer adjacent to the red image. The green image had excellent adhesion to the support, and no missing parts or defects in shape were detected therein.

Furthermore, similar procedures as described above were repeated for the formation of a blue image, to thereby obtained a glass plate having a trichromatic image embedded in the adhesive layer thereof.

Furthermore, a light-shielding black image was formed in the same manner as described above, except that the exposure was carried out through a photomask with a striped pattern.

Thus, a glass plate having thereon a matrix-form pattern of red, green and blue images and a striped black image pattern (for shielding light) was obtained. No defects in shape were observed in any of the colored images, and no pin-holes were detected therein.

Finally, the glass plate was exposed to UV rays on both sides thereof without interposing a cut-off filter therebetween to cure the adhesive layer.

In the above-described manner, a glass plate fitted with the color filter consisting of R-, G- and B-matrix images and a black striped pattern was obtained.

EXAMPLE 2

(An example utilizing positively working light-sensitive layers)

Four kinds of positively working, colored, light-sensitive resin sheets were prepared in the same manner as in Example 1, except that light-sensitive solutions of four different colors, having the respective compositions shown in Table 2 below, were coated in the place of the corresponding coating solutions of Example 1 to give a dry thickness of 0.5 μm.

In the same manner as Example 1, the transfer, the image-wise exposure and the development operations were performed repeatedly to obtain an image-receiving sheet having an image in four different colors, except that the imagewise exposure was carried out through a positive-positive type matrix-form mask. Thus, a glass plate fitted with a color filter composed of R-, G- and B-matrix images and black stripes, which had been transferred in their individually intended patterns, was obtained.

TABLE 2

(Coating Compositions for Positively Working, light-sensitive, Colored Layers)

| | R (g) | B (g) | G (g) | Bl (g) |
| --- | --- | --- | --- | --- |
| Product of addition reaction between acetone/pyrogallol condensate (average polymerization degree = 3) and 2-diazo-1-naphthol-4-sulfonyl-chloride | 1.02 | 0.61 | 0.87 | 0.61 |
| Novolak type phenol-formaldehyde resin (PR-50716, products of Sumitomo Durez Co., Ltd.) | 2.87 | 1.72 | 2.44 | 1.72 |
| Abietic acid | 1.23 | 1.73 | 1.05 | 1.73 |
| Irgadine Red BPT | 0.15 | | | |
| Sudan Blue | | 0.15 | | |
| Lead phthalocyanine | | | 0.15 | |
| Carbon black | | | | 0.15 |
| Tricresyl phosphate | 0.51 | 0.31 | 0.44 | 0.31 |
| Fluorine-containing surface active agent (FC-430, product of 3M Co.) | 0.04 | 0.04 | 0.04 | 0.04 |
| Methyl ethyl keto ne | 19.0 | 19.5 | 17.0 | 19.0 |
| Ethylene glycol monomethyl ether acetate | 44 | 44 | 44 | 44 |
| Ethylene glycol monomethyl ether | 44 | 44 | 44 | 44 |

EXAMPLE 3

A polarizing plate fitted with a color filter was obtained in the same manner as in Example 1, except that a polarizing plate, Barilite (produced by Sunritsu Denki K.K.), was used in the place of the glass plate having a thickness of about 1.6 mm.

EXAMPLE 4

A color filter was obtained in the same manner as in Example 1, except that a polyethylene terephthalate film provided with a gelatin subbing layer of about 170 μm in thickness was used in the place of the glass plate having a thickness of about 1.6 mm.

EXAMPLE 5

A color filter was obtained in the same manner as in Example 1, except that a transparent glass substrate provided with a clear electrode on one side was used in the place of the glass plate, and the images were transferred to the electrode side of the substrate.

In the color filters obtained in Examples 1 to 5, accurate patterns were formed, and excellent registering of the differently colored patterns was also effected. Moreover, no spectral changes were observed in each colored pattern even when these color filters were stored for 2 hours at 170° C. in contact with air.

EXAMPLE 6

(An example of utilizing a light-insensitive adhesive layer)

A coating composition. described below was coated on a glass plate having a thickness of 1.6 mm, and dried to form a light-insensitive, heat-sensitive adhesive layer of 20 μm in dry thickness. On this adhesive layer, a 30 μm-thick polyethylene film was laminated as a protective film.

| Coating Composition for Adhesive Layer: | |
|---|---|
| Polyvinyl butyral (Denka Butyral #2000-L. product of Denki Kagaku Kogyo Kabushiki Kaisha) | 4 |
| Fluorine-containing surface active agent (Fluorad FC-430, product of 3M Co.) | 0.05 g |
| Silane coupling agent KBM-403 (γ-glycidoxy-propyltrimethoxysilane, product of Shinetsu Silicone Co., Ltd.) | 2.5 g |
| Methanol | 50 ml |
| Methyl ethyl ketone | 20 ml |
| Ethylene glycol monomethyl ether acetate | 20 ml |

A glass plate fitted with a color filter constructed by matrix-form images of R, G and B colors and black stripes which had been transferred thereto in predetermined patterns was obtained in the same manner as in Example 1, except that the irradiation of the adhesive layer with UV rays was not conducted.

EXAMPLE 7

(An example of utilizing light-sensitive layers provided with a subbing layer and a monolayer-form light-sensitive image-re-receiving layer)

A 5% water solution of PVA (saponification degree=82%, polymerization degree=about 500) was coated on a polyethylene terephthalate film (thickness=20 μm) as a temporary support, and dried for 2 min. at 80° C. to form a subbing layer thereon of 0.1 μm in dry thickness.

As coating compositions for forming light-sensitive colored resin layers, light-sensitive solutions of four different colors, a black color (for a light-shielding layer), a red color (for a R layer), a green color (for a G layer) and a blue color (for a B layer), were prepared having the compositions indicated in the following Table 3 below.

TABLE 3

(Coating Compositions for Colored. Light-Sensitive Layers)

| | R (g) | B (g) | G (g) | Bl (g) |
|---|---|---|---|---|
| Benzylmethacrylate/Methacrylic Acid Copolymer (molar ratio = 70/30, weight average molecular weight = 20,000) | 62 | 62 | 62 | 62 |
| Pentaerythritol Tetraacrylate | 38 | 38 | 38 | 38 |
| 2-Benzoylmethylene-3-methyl-β-naphtothiazoline | 3 | 3 | 3 | 3 |
| 2-(p-Methoxyphenyl)-4,6-bis-(trichloromethyl)-s-triazine | 3 | 3 | 3 | 3 |
| Carmine 6B (C. I. 12490, red) | 20 | | | |
| Phthalocyanine Blue (C. I. 74160, blue) | | 18 | | |
| Phthalocyanine Green (C. I. 74260, green) | | | 18 | |
| Carbon Black (MA-100, products of Mitsubishi Chemical Industries, Ltd.) | | | | 20 |
| Cellosolve Acetate | 650 | 650 | 650 | 650 |

The above light-sensitive solutions of four colors were each coated on four separate temporary supports provided with the above-described subbing layer, and dried to form light-sensitive colored resin layers having a dry thickness of 0.5 μm, respectively.

A 30 μm-thick polyethylene film was laminated as a protective sheet on each of the light-sensitive colored resin layers.

Thus, four kinds of light-sensitive colored resin sheets (negatively working, light-sensitive, colored sheets) were prepared, each consisting of the temporary support, the subbing layer, the light-sensitive colored resin layer and the protective sheet, arranged in that order.

Separately, an adhesive layer was formed on a glass plate in the same manner as in Example 1.

The protective sheet was peeled apart from the light-sensitive red resin sheet, and the resulting red resin sheet was superposed on the adhesive layer such that the light-sensitive resin layer was contacted with the adhesive layer. Then, the superposed material was subjected to a laminating operation using a laminator (Fast Laminator 8B-550-80, made by Taisei Shoji K.K.) under a pressure was 2 Kg/m², a roller temperature of 105° C., and a laminating speed of 0.9 m/min. Thereafter, the temporary support was peeled apart from the light-sensitive red resin sheet, whereby the light-sensitive red resin layer was transferred together with the subbing layer to the glass plate via the adhesive layer.

Subsequently, a mask having a matrix-form pattern was superposed upon the glass plate, and exposed by means of a ultra-high pressure mercury lamp of 2 Kw placed at a distance of 50 cm on the mask side. The thus exposed light-sensitive red resin sheet was developed for 20 seconds at 35° C. using a developer having the composition described below, and subsequently washed with water and dried to obtain a red image on the glass plate.

| Composition of Developer: | |
|---|---|
| Sodium carbonate | 15 g |
| Butyl cellosolve | 1 g |
| Water | 1 g |

The red image on the adhesive layer was passed between a pair of Teflon rollers under a roller surface temperature of 105° C., a between-roller pressure of 2.0

Kg/cm² and a passing speed of 0.5 m/min. Thus, the red image was embedded into the adhesive layer.

To the resulting adhesive layer was transferred the light-sensitive resin layer of a blue color in the same manner as described above. Then, a matrix-form photomask was superposed on the light-sensitive blue resin layer such that the blue image to be formed would be adjacent to the red image. The laminate was exposed, and then developed in the same manner as described above. In this manner, a blue image adjacent to the red image was obtained on the adhesive layer. No defects or missing parts were detected in the thus formed blue image elements.

Furthermore, similar procedures as described above were repeated for the formation of a green image, to obtain a glass plate having a trichromatic image embedded in the adhesive layer thereof.

Furthermore, a black image of a striped pattern was formed in the same manner as described above, except that the exposure was carried out through a photomask with a striped pattern.

Thus, a glass plate carrying a black striped image with red, blue and green matrix patterns was obtained. No missing parts or defects were observed in any image element, and no pin-holes or turbidity were detected therein.

EXAMPLE 8

Light-sensitive resin layers provided with a subbing layer on temporary supports were prepared in the same manner as in Example 7, and a light-sensitive adhesive layer on a glass plate was prepared in the following manner.

The same coating composition for an adhesive layer as used in Example 1 was coated-on a temporary support of a polyethylene terephthalate film (thickness=20 μm), and dried for 2 min. at 100° C. to form a light-sensitive adhesive layer having a dry thickness of 5 μm. On this light-sensitive adhesive layer, a 20 μm-thick polyethylene film was laminated as a protective sheet. Thus, a light-sensitive adhesive sheet comprising a temporary support, a light-sensitive adhesive layer and a protective sheet, arranged in that order, was obtained.

The protective sheet was peeled apart from the light-sensitive adhesive sheet, and the resulting adhesive sheet was superposed on a glass plate (1.6 mm in thickness) previously washed successively with alkali and water, and then dried with the face of the adhesive layer turned to the glass surface, followed by a laminating operation using a laminator (Fast Laminator 8B-550-80, made by Taisei Shoji K.K.) under a pressure of 2 Kg/cm², a roller temperature of 105° C. and a laminating speed of 0.9 m/min. Thereafter, the temporary support of the light-sensitive adhesive sheet was peeled apart, whereby direct transfer of the light-sensitive adhesive layer to the glass plate was completed.

In the same manner as in Example 1, light-sensitive resin sheets of red, green and blue colors were each transferred to the light-sensitive adhesive layer, and subjected successively to exposure, development and embedding processes resulting in the production of a glass provided with a color filter having red, green and blue matrix images and black stripes formed in a predetermined pattern.

EXAMPLE 9

(An example of utilizing a monolayer-form adhesive layer of low sensitivity)

A 1.6 mm-thick glass plate was coated with the following coating composition for forming an adhesive layer, and then dried. Thus, an adhesive layer having a dry thickness of 5 μm was formed. On this adhesive layer, a 30 μm-thick polyethylene film was laminated as a protective film at room temperature.

| Coating Composition for Adhesive Layer: | |
|---|---|
| Methyl ethyl ketone | 2,600 g |
| Dianal BR-77 (acrylic resin, product of Mitsubishi Rayon Company Limited) | 168 g |
| Dianal BR-64 (acrylic resin, product of Mitsubishi Rayon Company Limited) | 168 g |
| Oxylac SH-101 (styrenemonopropylmaleate copolymer, product of Nippon Shokubai Kagaku Kogyo Co., Ltd.) | 59 g |
| NK Ester TMMT (pentaerythritol tetraacrylate, product of Shin Nakamura Kagaku K.K.) | 216 g |
| Megafac F-177P (fluorine-containing surface active agent, product of Dai-Nippon Ink & Chemicals, Inc.) | 3.8 g |
| Hydroquinone monomethyl ether | 0.5 g |
| Irgacure 651 (dimethoxyphenylacetophenone, product of Ciba Geigy Ltd.) | 3 g |
| Silane coupling agent KBM-403 (γ-glycidoxypropyltrimethoxysilane, product of Shinetsu Silicone Co., Ltd.) | 2.5 g |

This adhesive layer was lower in sensitivity to UV rays than that prepared in Example 1 such that UV rays were used for exposure without a cut-off filter for wavelengths shorter than 400 nm. In the imagewise exposure of the light-sensitive colored resin layers carried out after transfer to the adhesive layer, no problems were encountered in the embedding processing of the colored images, and no missing image parts or defects in shape of the image elements were observed.

EXAMPLE 10

(An example of carrying out an embedding operation once alone)

A polychromatic colored image was formed using the same materials as in Example 1 but in the following manner.

The protective film was peeled apart from the light-sensitive red resin sheet, and the resulting sheet was superposed on the glass plate from which the protective film had been removed, such that the light-sensitive resin layer was contacted with the adhesive layer on the glass plate. Then, the superposed material was subjected to a laminating operation using a laminator (Fast Laminator 8B-550-80, made by Taisei Shoji K.K.) under a pressure of 2 Kg/m², a roller temperature of 105° C., and a laminating speed of 0.9 m/min. Thereafter, the temporary support was peeled apart from the light-sensitive red resin sheet, whereby the light-sensitive red resin layer was transferred to the glass plate via the adhesive layer.

Subsequently, a photomask having a matrix-form pattern the elements of which having a one-side length of 120 μm was superposed upon the light-sensitive red resin layer laminated on the adhesive layer, and exposed by means of a ultra-high pressure mercury lamp of 2 Kw through a cut-off filter for wavelengths below 400 nm and placed at a distance of 50 cm on the photomask side. The thus exposed light-sensitive red resin layer was developed for 20 seconds at 35° C. using a developer having the composition described below, and subsequently washed with water and dried to obtain a red image on the glass plate.

| Composition of Developer: | |
| --- | --- |
| Sodium carbonate | 15 g |
| Butyl cellosolve | 1 g |
| Water | 1 g |

To the resulting adhesive layer was transferred the light-sensitive resin layer of a green color in the same manner as described above. Then, a matrix-form photomask was superposed on the light-sensitive green resin layer such that the green image to be formed would be adjacent to the red image, exposed to UV rays through a cut-off filter for wave-lengths below 400 nm, and then developed in the same manner as described above. A green-image adjacent to the red image was thus obtained on the adhesive layer. The green image had excellent adhesion to the support, and no missing parts or defects in shape were detected therein.

Furthermore, similar procedures as described above were repeated for the formation of a blue image, to obtain a glass plate containing a trichromatic image embedded in the adhesive layer thereof.

Furthermore, a light-shielding black image was formed in the same manner as described above, except that the exposure was carried out through a photomask with a striped pattern.

Thus, a glass plate carrying matrix-form pattern of red, green and blue images on which a light-shielding (black striped) pattern was superimposed was obtained. No defects in shape were observed in any of the colored images, and no pin-holes were detected therein.

A 20 μm-thick polyethylene terephthalate film, the surface of which had been treated with a silicone lubricant, was inserted between one of a pair of rollers and the multi-color image on the adhesive layer with its lubricant-treated face turned to the face of the multi-color image. The multicolor image covered with the film was passed between the pair of rollers under a controlled roller surface temperature of 105° C., a between-roller pressure of 2.0 Kg/cm$^2$ and a passing speed of 0.5 m/min, to thereby embed the multicolor image in the adhesive layer. No defects in shape were observed in any of image elements, and no pin-holes were detected therein.

Finally, the glass plate was exposed to UV rays on both sides thereof without interposing a cut-off filter therebetween.

In the above-described manner, a glass plate provided with a color filter consisting of R-, G- and B-matrix images and a black striped pattern was obtained.

COMPARATIVE EXAMPLE 1

After the red image was formed on the adhesive layer in the same manner as in Example 1, the light-sensitive resin layer of a green color was laminated on the resulting adhesive layer without embedding the resin layer using rollers. The green resin layer was not in close contact with the image-receiving layer, such that the green image formed by subsequent exposure and development processings resulted in an unacceptable level of missing parts, and bubbles were observed between the green image and the image-receiving layer.

As described in detail above, a polychromatic colored image of excellent quality is obtained in accordance with the methods of the present invention.

The effects of the present invention are achieved when an image forming material having a peel-apart layer is used, and the temporary support thereof is peeled apart before imagewise exposure.

While the invention has been described in detail and with reference to specific examples thereof, it will be apparent to one skilled in the art that various changes and modifications can be made therein without departing from the spirit and scope thereof.

What is claimed is:

1. A method of producing a polychromatic colored image having an integer value of n colored patterns (n≧2), comprising the steps of:
   (a) contacting a light-sensitive colored resin layer of an image-forming material comprising said light-sensitive resin layer provided on a temporary support transmissive of ultraviolet rays with an adhesive layer provided on a permanent support;
   (b) imagewise exposing the light-sensitive resin layer to a pattern through the temporary support;
   (c) peeling the temporary support from the imagewise exposed light-sensitive resin layer;
   (d) developing the imagewise exposed light-sensitive resin layer to form a colored pattern on the adhesive layer;
   (e) embedding the colored pattern formed on the adhesive layer into the surface of the adhesive layer by applying pressure to the colored pattern through a material having a surface energy lower than that of both of the patterned resin layer and adhesive layer;
   (f) contacting a light-sensitive resin layer of another image-forming material comprising a light-sensitive resin layer provided on a temporary support transmissive of ultraviolet rays and which resin layer is colored in a tint different from resin layers previously formed on the adhesive layer with the pattern-embedded adhesive layer;
   (g) repeating steps (b) to (e); and
   (h) repeating step (f) followed by steps (b) to (e) n−2 times to form and embed n colored patterns into the adhesive layer.

2. A method of producing a polychromatic colored image having on integer value of n colored patterns (n≧2), comprising the steps of:
   (a) contacting a light-sensitive colored resin layer of an image-forming material comprising a light-sensitive resin layer provided on a temporary support transmissive of ultraviolet rays with an adhesive layer provided on a permanent support;
   (b) imagewise exposing the light-sensitive resin layer to a pattern through the temporary support;
   (c) peeling the temporary support from the imagewise exposed light-sensitive resin layer;
   (d) developing the imagewise exposed light-sensitive resin layer to form a colored pattern on the adhesive layer;
   (e) contacting a light-sensitive resin layer of another image-forming material having the same structure as that of step (a), except for having a resin layer colored in a tint different from resin layers previously formed on the adhesive layer with the adhesive layer on which a colored pattern is formed;

(f) imagewise exposing the light-sensitive resin layer to a pattern through the temporary support;

(g) peeling the temporary support from the imagewise exposed light-sensitive resin layer;

(h) developing the light-sensitive resin layer in a developer to form a colored pattern on the adhesive layer;

(i) repeating steps (e) to (h) n−2 times to form n colored patterns on the adhesive layer; and (j) embedding the colored patterns colored in at least two different tints which have been formed on the adhesive layer into the surface of the adhesive layer by applying pressure thereto through a material having a surface energy lower than the colored resin patterns and the adhesive layer.

3. A method as in claim 1, wherein a peel-apart layer transmissive of ultraviolet rays is arranged in between the light-sensitive resin layer and the temporary support of each of image forming materials.

4. A method of producing a polychromatic colored image having an integer value of n colored patterns (n≧2), comprising the steps of:

(a) contacting a light-sensitive colored resin layer of an image-forming material comprising said light-sensitive resin layer provided on a temporary support via a peel-apart layer, which peel-apart layer is transmissive to ultraviolet rays, with an adhesive layer provided on a permanent support;

(b) peeling the temporary support from the peel-apart layer;

(c) imagewise exposing the light-sensitive resin layer to a pattern through the peel-apart layer;

(d) developing the light-sensitive resin layer in a developer to simultaneously remove the peel-apart layer through dissolution in the developer and to form a colored pattern on the adhesive layer;

(e) embedding the colored pattern formed on the adhesive layer into the surface of the adhesive layer by applying pressure to the colored pattern through a material having a surface energy lower than that of both the patterned resin layer and the adhesive layer;

(f) contacting a light-sensitive resin layer of another image-forming material comprising a light-sensitive resin layer provided on a temporary support via a peel-apart layer, which peel-apart layer is transmissive to ultraviolet rays, and which resin layer is colored in a tint different from the resin layers previously formed on the adhesive layer, with the pattern-embedded adhesive layer;

(g) repeating steps (b) to (e); and (h) repeating step (f) followed by steps (b) to (e) n−2 times to form and embed n colored patterns into the adhesive layer.

5. A method of producing a polychromatic colored image having an integer value of n colored patterns (n≧2), comprising the steps of:

(a) contacting a light-sensitive colored resin layer of an image-forming material comprising said light-sensitive resin layer provided on a temporary support via a peel-apart layer, which peel-apart layer is transmissive to ultraviolet rays, with an adhesive layer provided on a permanent support;

(b) peeling the temporary support from the peel-apart layer;

(c) imagewise exposing the light-sensitive resin layer to a pattern through the peel-apart layer;

(d) developing the light-sensitive resin layer in a developer to simultaneously remove the peel-apart layer through dissolution and to form a first colored pattern on the adhesive layer;

(e) contacting a light-sensitive resin layer of another image-forming material comprising a light-sensitive resin layer provided on a temporary support via a peel-apart layer, which peel-apart layer is transmissive to ultraviolet rays, and which resin layer is colored in a tint different from the resin layers previously formed on the adhesive layer, with the adhesive layer on which a colored pattern is formed;

(f) imagewise exposing of the light-sensitive resin layer to a pattern through the temporary support;

(g) peeling the temporary support from the peel-apart layer;

(h) developing the light-sensitive resin layer in a developer to from a colored pattern on the adhesive layer;

(i) repeating steps (e) to (h) n−2 times to form n colored patterns on the adhesive layer; and (j) embedding the colored patterns colored in at least two different tints which have been formed on the adhesive layer into the surface of the adhesive layer by applying pressure thereto through a material having a surface energy lower than the colored resin patterns and the adhesive layer.

6. A method of producing a polychromatic colored image having an integer value of n colored patterns (n≧2), comprising the steps of:

(a) contacting a light-sensitive colored resin layer of an image-forming material comprising said light-sensitive resin layer provided on a temporary support via a peel-apart layer, which peel-apart layer is transmissive to ultraviolet rays, with an adhesive layer provided on a permanent support;

(b) peeling the temporary support form the peel-apart layer;

(c) imagewise exposing the light-sensitive resin layer to a pattern through the peel-apart layer;

(d) removing the peel-apart layer by washing with water;

(e) developing the light-sensitive resin layer in a developer to form a colored pattern on the adhesive layer;

(f) embedding the colored pattern formed on the adhesive layer into the surface of the adhesive layer by applying pressure to the colored pattern through a material having a surface energy lower than that of both of the colored resin pattern and the adhesive layer;

(g) contacting light-sensitive resin layer of another image-forming material comprising a light-sensitive resin layer provided on a temporary support via a peel-apart layer, which peel-apart layer is transmissive to ultraviolet rays, and which resin layer is colored in a tint different from the resin layers previously formed on the adhesive layer, with the pattern-embedded adhesive layer;

(h) repeating steps (b) to (f); and (i) repeating step (g) followed by steps (b) to (f) n−2 times to form and embed n colored patterns into the adhesive layer.

7. A method of producing a polychromatic colored image having an integer value of n colored patterns (n≧2), comprising the steps of:
   (a) contacting a light-sensitive colored resin layer of an image-forming material comprising said light-sensitive resin layer provided on a temporary support via a peel-apart layer, which peel-apart layer is transmissive to ultraviolet rays, with an adhesive layer provided on a permanent support;
   (b) peeling the temporary support from the peel-apart layer;
   (c) imagewise exposing the light-sensitive resin layer to a pattern through the peel-apart layer;
   (d) removing the peel-apart layer by washing with water;
   (e) developing the light-sensitive resin layer in a developer to form a colored pattern on the adhesive layer;
   (f) contacting a light-sensitive resin layer of another image-forming material comprising a light-sensitive resin layer provided on a temporary support via a peel-apart layer, which peel-apart layer is transmissive to ultraviolet rays, and which resin layer is colored in a tint different from the resin layers previously formed on the adhesive layer, with the adhesive layer on which a colored pattern is formed;
   (g) peeling the temporary support from the peel-apart layer;
   (h) imagewise exposing the light-sensitive resin layer to a pattern through the peel-apart layer;
   (i) removing the peel-apart layer by washing with water;
   (j) developing the light-sensitive resin layer in a developer to form a colored pattern on the adhesive layer;
   (k) repeating steps (f) to (j) n−2 times to form n colored patterns on the adhesive layer; and
   (l) embedding the colored patterns colored in at least two different tints which have been formed on the adhesive layer into the surface of the adhesive layer by applying pressure thereto through a material having a surface energy lower than that of the colored resin patterns and the adhesive layer.

8. A method as in claim 1, wherein the colored images embedded in the adhesive layer include red, green, blue and black patterns, and the permanent support is substantially transparent.

9. A method as in claim 1, wherein said colored images embedded in the adhesive layer include yellow, cyan, magenta and black patterns.

10. A method as in claim 1, wherein the adhesive layer comprises a negatively working light-sensitive resin composition having a softening point of from 10° C. to 140° C and which resin composition is resistant to an alkali developing solution.

11. A method as in claim 10, wherein the adhesive layer of the negatively working light-sensitive resin composition has a photosensitivity lower than about one-third the photosensitivity of each of the colored light-sensitive resin layers.

12. A method as in claim 11, further comprising the step of exposing the adhesive layer having the embedded colored patterns to light to cure the adhesive layer.

13. A method as in claim 10, wherein the adhesive layer of the negatively working light-sensitive resin composition has a photosensitivity at wavelength ranges substantially different from those wavelength ranges at which the light-sensitive colored resin layers are photosensitive.

14. A method as in claim 2, wherein a peel-apart layer transmissive to ultraviolet rays is arranged between the light-sensitive resin layer and the temporary support of each of the image forming materials.

15. A method as in claim 4, wherein the peel-apart layer has a thickness of from 0.2 to 10.0 μm.

16. A method as in claim 1, wherein each of the light-sensitive resin layers has a dry thickness of from 0.3 to 10 μm.

17. A method as in claim 1, wherein the permanent support is selected from a biaxially stretched polyethylene terephthalate film and a glass plate.

18. A method as in claim 1, wherein each of the adhesive layers has a thickness of from 1 to 100 μm.

19. A method as in claim 1, wherein the material having a surface energy lower than that of both of the patterned resin layer and the adhesive layer is selected from a silicone resin and a fluorine-containing resin in the form of a film having a thickness of from 5 to 200 μm.

20. A method as in claim 1, wherein a pressure of from 1.5 to 2.5 kg/cm$^2$ is applied to embed the colored pattern into the surface of the adhesive layer.

* * * * *